(12) United States Patent
Lee et al.

(10) Patent No.: US 6,803,640 B1
(45) Date of Patent: Oct. 12, 2004

(54) CAPACITOR

(75) Inventors: In-Jung Lee, Seoul (KR); Heon-Joung Shin, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/633,366

(22) Filed: Aug. 7, 2000

(30) Foreign Application Priority Data

Jan. 5, 2000 (KR) ............................................ 2000-280

(51) Int. Cl.[7] .......................... H01L 27/08; H01L 29/76; H01L 29/94; H01L 31/119
(52) U.S. Cl. ...................................... 257/532; 257/296
(58) Field of Search .................................. 251/295–310, 251/532; 438/3, 240, 252, 254, 396–398

(56) References Cited

U.S. PATENT DOCUMENTS 5,767,541 A * 6/1998 Hanagasaki ................. 257/295
6,033,950 A * 3/2000 Chen et al. .................. 438/252

* cited by examiner

Primary Examiner—Cuong Nguyen

(74) Attorney, Agent, or Firm—Mills & Onello, LLP

(57) ABSTRACT

The present invention relates to a WACC and a fabricating method thereof to prevent the occurrence of lifting between a polysilicon layer pattern and blocking metal layer of an upper electrode. In order to accomplish the object of the present invention, there is provided a capacitor having upper and lower electrodes and a dielectric layer therebetween, wherein the upper electrode has a polysilicon pattern constructed in a deposition structure of "first undoped polysilicon layer/doped polysilicon layer/second undoped polysilicon layer" to be connected with a first metal pattern at the top portion, and the lower electrode has first and second metal patterns to be connected with a p++ type silicon substrate at the bottom portion. The first metal pattern is preferably constructed in a deposition structure of "blocking metal layer/aluminum layer", where the blocking metal layer is preferably constructed in a "Ti/TiN" deposition structure. Accordingly, the capacitor is constructed to enable the blocking metal layer to be in contact with an undoped polysilicon layer, rather than a doped polysilicon layer as in conventional embodiments, to achieve an effect that the doffing level of the polysilicon layer is reduced as compared to the conventional configuration, thereby enhancing formation of the silicide layer between the polysilicon layer and the blocking metal layer to improve adhesion and prevent the occurrence of lifting.

5 Claims, 4 Drawing Sheets

CAPACITOR

BACKGROUND OF THE INVENTION

1. Field of Invention

The present invention relates to a semiconductor device and a fabricating method therefor, and more particularly to a capacitor and a fabricating method therefor in an manner that prevents the occurrence of lifting between a polysilicon pattern and a blocking metal layer of an upper electrode in the process of a wire-bond attached chip capacitor (hereinafter referred to as WACC).

2. Description of the Prior Art

A wire-bond attached chip capacitor (WACC) is mounted to an integrated circuit (IC), or chip, for enhancement of stable operation. The WACC is coupled to the IC by wire-bonding pads respectively positioned between the IC components and the WACC.

Generally, the WACC has been widely deployed in the power supply of semiconductor devices and other electronic devices. FIGS. 1a through 1d are diagrams for illustrating sequential processes of a conventional WACC fabrication method. With reference to the drawings, the method for fabricating the conventional WACC will now be described in detail.

As shown in FIG. 1a, a first insulating layer 12 of an oxide layer is formed on a p++ type silicon substrate 10. The first insulating layer 12 is selectively etched to expose an active area of the substrate 10. Accordingly, the substrate 10 of the active area positioned at the upper electrode is selectively etched to a predetermined thickness to form a plurality of trenches (t) in the substrate 10.

As shown in FIG. 1b, an oxide-nitride-oxide (ONO) dielectric layer 14 is formed on the resultant structure of FIG. 1a. A polysilicon layer 16 is constructed in a deposition structure comprising an undoped polysilicon layer 16a below a doped polysilicon layer 16b (referred to herein as an "undoped/doped" structure) formed over the dielectric layer 14. At this time, the undoped polysilicon layer 16a is formed at a thickness of 500 Angstroms (hereinafter referred to as A) at 620° C., while the doped polysilicon layer 16b is formed at a thickness of 2500 A at 540° C. The purpose of the 'undoped/doped' doubly layered structure in the polysilicon layer 16 is because the trenches t are formed for fabricating a capacitor to increase its effective area in designing a semiconductor device in accordance with a design rule of less than 0.25 $\mu$m. Relying on solely the application of a general impurity impregnation process, it would be difficult to impregnate enough impurity to the upper end of the polysilicon layer 16.

As shown in FIG. 1c, the polysilicon layer 16 is removed, save the region of the upper electrode forming portion, so as to form a polysilicon pattern 16'. In the aforementioned process, the top oxide layer of the ONO dielectric layer 14 is also removed, causing thinning of the resultant dielectric layer 14. Accordingly, any remaining dielectric layer 14 remaining beyond the portion covered by the polysilicon pattern 16' is eliminated. In order to make an ohmic contact between a blocking metal layer (a layer to be deposited during the next step) and the active area, p+ type impurity 24 is ion-impregnated in blanket onto the structure. As a result, a p+ type impurity diffusion area 18 is formed in the substrate 10 in the active region positioned at one side of the polysilicon pattern 16'.

As shown in FIG. 1d, the blocking metal layer is formed and annealed over the surface constructed by the previous processes, and an aluminum layer is, then, formed thereon. As a result, a first metal layer of a "blocking metal layer/aluminum layer" deposition structure is formed. For example, the blocking layer may comprise a "Ti/TiN" deposition structure, wherein Ti is formed in thickness of 150 A and TiN is formed in thickness of 1000 A. The Ti of the blocking metal layer forms a silicide layer by reacting with the lower silicon (named for the combination of the polysilicon pattern and p++ type silicon substrate) in the annealing process, so as to improve adhesion between the blocking metal layer and silicon. TiN of the blocking metal layer prevents diffusion of the aluminum layer into the silicon in the deposition of the first metal layer. Accordingly, the first metal layer is selectively etched to expose a predetermined part of the first insulating layer 12, thereby respectively forming a first metal pattern 20a to be connected with the polysilicon pattern 16' and a first metal pattern 20b to be connected with the p+ type impurity diffusion area 18. Then, a second insulating layer 22 made of an oxide layer as inter-layer insulating material is formed on the first insulating layer 12 that includes the first metal patterns 20a, 20b. A via hole (h) is then formed by selectively etching the second insulating layer 22 to expose a predetermined portion of the first metal pattern 20b connected with the p+ type impurity diffusion area 18. Finally, the second metal pattern 24 is formed on the second insulating layer 22 that includes the via hole (h), thereby completing the fabrication process.

As shown in FIG. 1d, a WACC is thus fabricated in the structure having an upper electrode (I) on its top portion, in which the polysilicon pattern 16' and the first metal pattern 20a are connected with the dielectric layer 14 positioned therebetween, and a lower electrode (II) on its bottom portion, in which the first metal pattern 20b and the second metal pattern 24 are connected with the p++ type substrate 10.

As a consequence of the above process, however, the fabricated WACC suffers from a number of limitations. For example, adhesion between the silicon and the upper blocking metal layer is determined by the degree to which the Ti and silicon react during the annealing process. The thickness of the resultant layer (for example the silicide layer) is generally known to be inversely proportional to the doping level of the lower silicon layer. In other words, if the impurity doping level of the lower silicon is high, the reacted layer becomes thinner. If the impurity doping level of the lower silicon is low, the reacted layer becomes thicker. In this configuration, the lower silicon layer indicates all of the polysilicon pattern 16' and the p++ type substrate 10.

Thus, in order to improve adhesion between Ti and silicon, the thickness of the reacted layer should be higher than a predetermined level thereof by lowering the impurity doping level of the lower silicon.

However, when the WACC is fabricated according to the aforementioned processes, the polysilicon layer is constructed in the "undoped/doped" double deposition structure. As a result, in addition to the high doping level of the polysilicon layer, the impurity doping level of the polysilicon pattern 16' becomes much higher by the blanket ion-impregnation of p+ type impurity, which has been additionally formed to make an ohmic contact. For this reason, the silicide layer is marginally formed between the polysilicon pattern 16' and the blocking metal layer. As a consequence, a problem arises in that adhesion between the polysilicon pattern 16' and the blocking metal layer of the upper electrode becomes weak, thereby resulting in the phenomenon of lifting therebetween.

SUMMARY OF THE INVENTION

It is therefore an object of the present invention to address the aforementioned limitations by providing a WACC having an upper electrode with its polysilicon layer constructed in a triply-layered deposition structure of "undoped/doped/undoped polysilicon layers" to enable the polysilicon layer contacting the blocking metal layer to be the undoped polysilicon layer. In this manner, an effective suicide layer is formed between the polysilicon layer and the blocking metal layer to reinforce adhesion and prevent occurrence of lifting therebetween.

It is another object of the present invention to provide a method for fabricating a capacitor that helps to effectively produce the semiconductor device constructed in the aforementioned structure.

In order to accomplish the aforementioned object of the present invention, there is provided a capacitor having a lower electrode, a dielectric layer and an upper electrode, wherein the upper electrode is constructed in a deposition structure of "first undoped polysilicon layer/doped polysilicon layer/second polysilicon layer".

In order to accomplish the other object of the present invention, there is provided a method for fabricating a capacitor having lower electrode, dielectric layer and upper electrode, wherein the upper electrode is formed in a deposition structure comprising a "first undoped polysilicon layer/doped polysilicon layer/second undoped polysilicon layer".

It is preferred that the first and second undoped polysilicon layers be formed at a thickness of less than 1000 A, the doped polysilicon layer be formed in thickness of 1800–2500 A, and the second undoped polysilicon layer be formed under the same temperature as that of the doped layer without any breakup of vacuum after formation of the doped polysilicon layer.

It is further preferred that the capacitor be designed to have a metal pattern in a deposition structure comprising "blocking metal layer/aluminum layer". The blocking metal layer is preferably constructed in a "Ti/TiN" deposition structure.

In the WACC thus fabricated, the blocking metal layer is contacted with an undoped polysilicon layer, rather than a doped polysilicon layer as in the conventional embodiment, to achieve the effect of reducing the doffing level of the polysilicon layer to lower than that of the conventional embodiment. This configuration significantly improves effectiveness in formation of a silicide layer between the polysilicon layer and the blocking metal layer, and prevents the occurrence of lifting therein.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Objects and aspects of the present invention will become apparent from the following detailed description of preferred embodiments with reference to the accompanying drawings.

FIGS. 2a through 2d are diagrams for illustrating sequential processes for a WACC fabricating method of the present invention. With reference to the aforementioned drawings, the sequential processes for fabricating WACC will be described below.

Figure 1A:
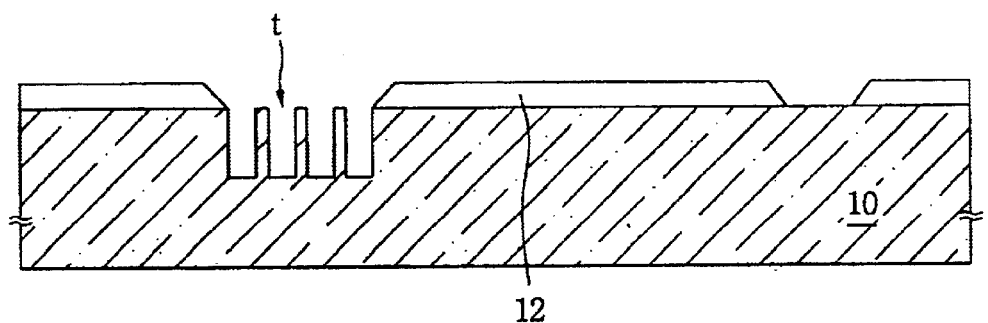
FIGS. 1a through 1d are diagrams for illustrating sequential processes for a conventional WACC fabrication method.
Figure 1B:
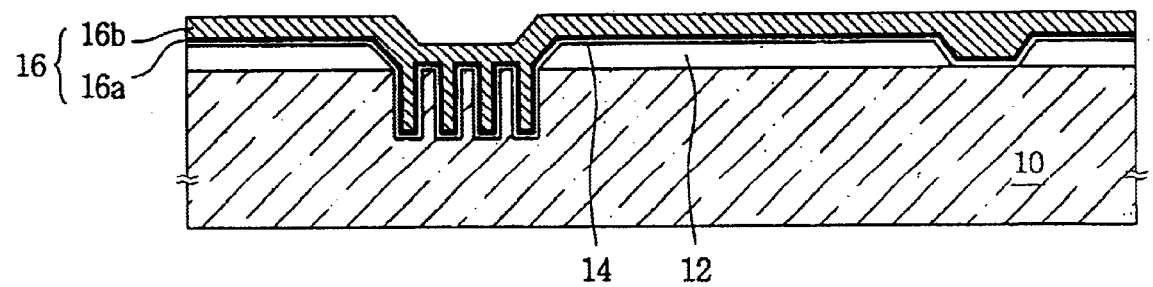
Figure 1C:
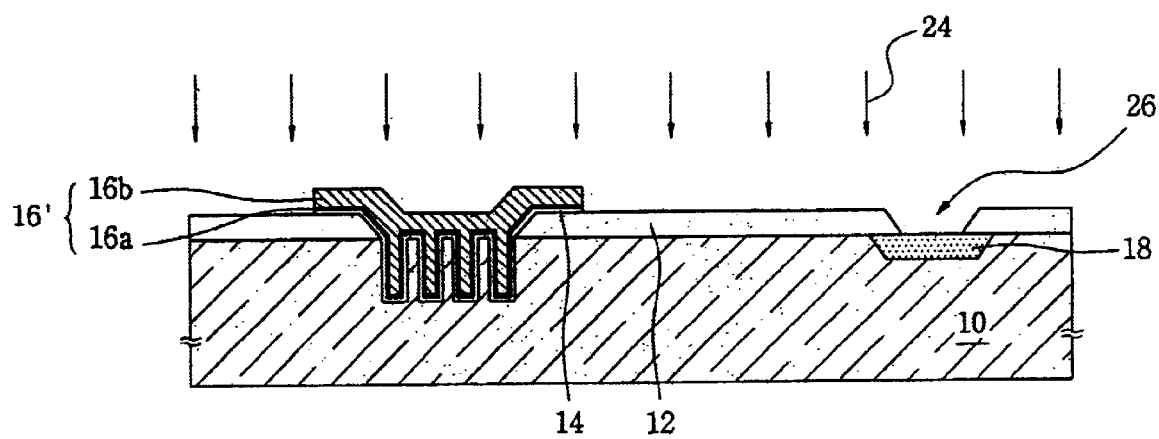
Figure 1D:
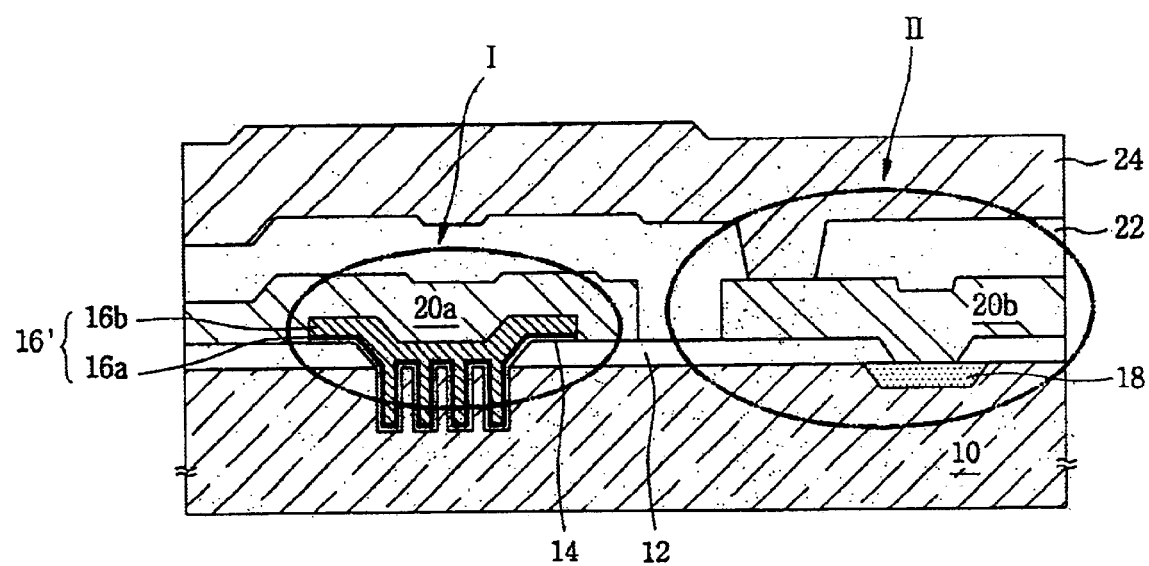
Figure 2A:
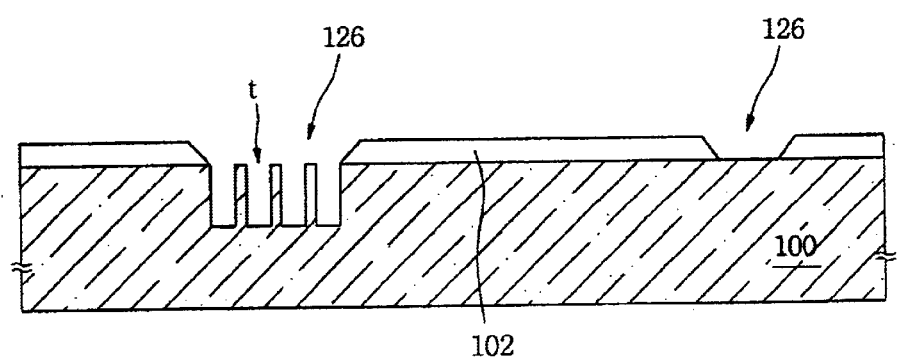
FIGS. 2a through 2d are diagrams for illustrating sequential processes for a WACC fabrication method according to the present invention.

As shown in FIG. 2a, a first insulating layer 102 of an oxide layer is formed on a p++ type silicon substrate 100, and the first insulating layer 102 is selectively etched to expose active regions 126 of the substrate. Accordingly, the substrate 100 in the active regions positioned at an upper electrode portion is selectively etched at a predetermined thickness to form a plurality of trenches (t) in the substrate 100.

Figure 2B:
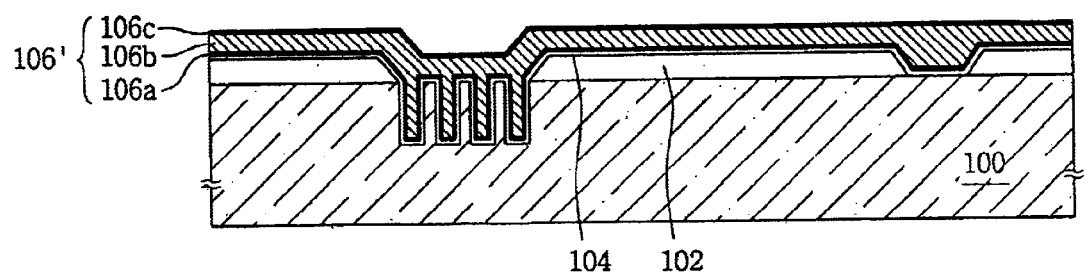

As shown in FIG. 2b, an oxide-nitride-oxide (ONO) dielectric layer 104 is formed on the resultant structure of FIG. 2a. In order to sufficiently fill up the trenches t, a polysilicon layer 106 is constructed according to the following deposition structure of a "first undoped polysilicon layer 106a/doped polysilicon layer 106b/second undoped polysilicon layer 106c" on the dielectric layer 104. The first undoped polysilicon layer 106a is preferably formed at a thickness of 1000 A at 620° C. while the doped polysilicon layer 106b is formed at a thickness of 1800 A–2500 A at 540° C. The second undoped polysilicon layer 106c is formed at a thickness of 1000 A at 540° C. without any breakup of vacuum after formation of the doped polysilicon layer 106b. The polysilicon layer 106 is constructed in this triply-layered deposition structure of "first undoped/doped/second undoped polysilicon" layers because it is preferred that the polysilicon layer in contact with the Ti of the blocking metal layer is the undoped form polysilicon layer during the deposition process of the following blocking metal layer (for instance, a "Ti/TiN" deposition structure of the blocking metal layer). In this manner, the doffing level of the polysilicon layer in contact with the blocking metal layer is lower for the configuration of the present invention as compared to that of the conventional configuration.

Figure 2C:
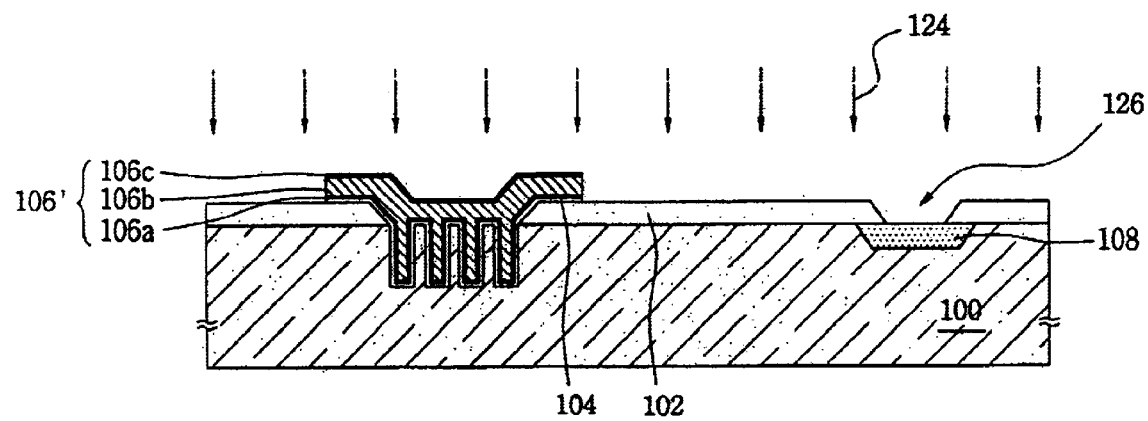

As shown in FIG. 2c, the polysilicon layer 106, save the region of the electrode, is removed to form a polysilicon pattern 106'. According to the aforementioned process, the top oxide layer of the ONO dielectric layer 104 is also removed, causing thinning of the resultant dielectric layer 104 during completion of the etching process. Accordingly, the remaining portion of the dielectric layer 104 is eliminated. In order to make an ohmic contact between the blocking metal layer to be deposited during the following step and the active region, p+ type impurity is ion-impregnated in blanket onto the formed structure. As a result, the p+ type impurity diffusion region 108 is formed in the substrate 100 in the active region 126.

Figure 2D:
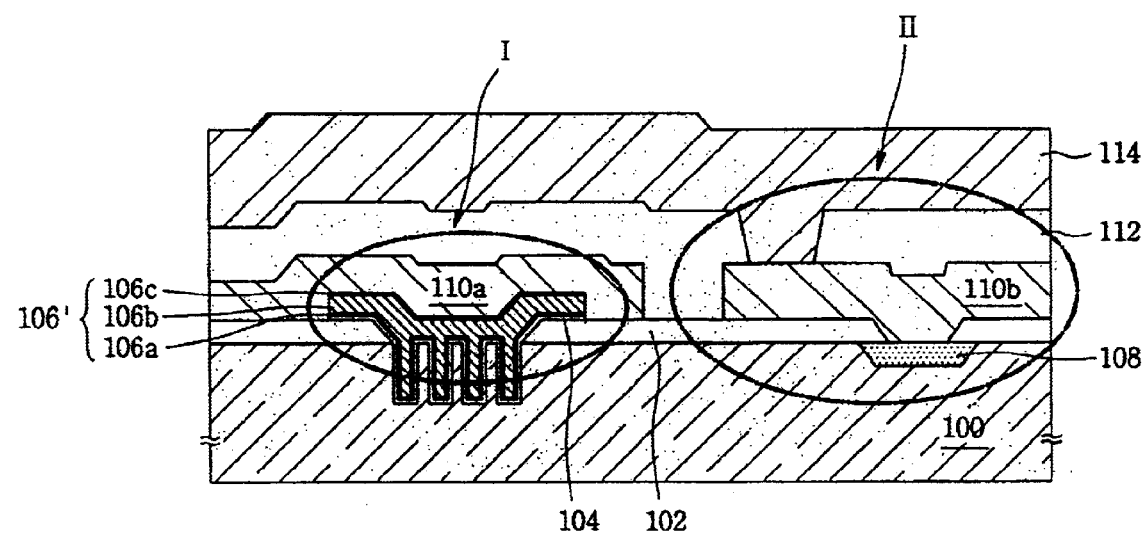

As shown in FIG. 2d, the blocking metal layer is formed and annealed over the surface constructed by the previous process, and an aluminum layer is then formed thereon. As a result, a first metal layer of a "blocking metal layer/aluminum layer" deposition structure is formed. The blocking metal layer preferably comprises a "Ti/TiN" deposition structure, wherein Ti is formed at a thickness of 150 A and TiN is formed at a thickness of 1000 A. The Ti of the blocking metal layer forms a silicide layer during the annealing process by reacting with silicon (named for all of the polysilicon pattern and p++ type silicon substrate), so as to improve adhesion between the blocking metal layer and silicon. Further, the TiN of the blocking metal layer prevents diffusion of the aluminum layer into the silicon during deposition of the first metal layer. Accordingly, the first metal layer 110 is selectively etched to expose a predetermined part of the first insulating layer 102, thereby respectively forming a first metal pattern 110a to be connected with the polysilicon pattern 106' and a first metal pattern 110b to be connected with the p+ type impurity diffusion area 108. Next, a second insulating layer 112 comprising an oxide layer as inter-layer insulating material is formed on the first insulating layer 102 and the first metal patterns 110a, 110b, and a via hole is formed by selectively etching the second insulating layer 112 to expose a predetermined part of the first metal pattern 110b connected with the p+ type impurity diffusion area 108. Finally, the second metal pattern 114 is formed on the second insulating layer 112 including the via hole, thereby completing the fabrication process.

As shown in FIG. 2d, a WACC is completed in a structure having an upper electrode (I) on its top portion, in which the polysilicon pattern 106' and the first metal pattern 110a are connected above the substrate 100, with the dielectric layer 104 being positioned therebetween, and the lower electrode (II) on its bottom portion, in which the first and second metal pattern 110b, 114 are connected with the p++ type substrate 100.

As described above, the polysilicon pattern 106' is constructed in a triply layered deposition structure of "first undoped polysilicon layer 106a/doped polysilicon layer 106b/second undoped polysilicon layer 106c", while the first metal patterns 110a, 110b are constructed in the "blocking metal layer/aluminum layer" deposition structure.

In the case of a WACC thus constructed, the Ti of the blocking metal layer contacts the second undoped polysilicon layer 106c to achieve an effect that the doffing level of the polysilicon layer is lower for the configuration of the present invention as compared to that of the conventional configuration, so that the silicide layer is more readily formed between the polysilicon layer and the blocking metal layer.

As a result, the structure of the WACC thus constructed provides enhancement of adhesion between polysilicon pattern 106' and blocking metal layer, and prevention and/or mitigation of the occurrence of lifting between the blocking metal layer and the polysilicon pattern 106' of the upper electrode.

As described above, there is an advantage in the WACC of the present invention, in that the polysilicon layer of the upper electrode is constructed in the triply layered deposition structure of "undoped/doped/undoped" to enable the undoped polysilicon layer come in contact with the blocking metal layer, thereby enhancing formation of a silicide layer between the polysilicon layer and the blocking metal layer (particularly, Ti) to improve adhesion and prevent the occurrence of lifting.

While this invention has been particularly shown and described with reference to preferred embodiments thereof, it will be understood by those skilled in the art that various changes in form and detail may be made herein without departing from the spirit and scope of the invention as defined by the appended claims.

What is claimed is:

1. A semiconductor capacitor having a lower electrode, a dielectric layer and an upper electrode, wherein the upper electrode comprises a deposition structure including three layers including a doped polysilicon layer formed between a first undoped polysilicon layer and a second undoped polysilicon layer, and a first metal pattern formed deposited over the upper electrode, wherein the semiconductor capacitor is a wire-bond attached chip capacitor.

2. The capacitor, as defined in claim 1, the first and second undoped polysilicon layers are formed at a thickness of less than 1000 A.

3. The capacitor, as defined in claim 1, wherein the doped polysilicon layer is formed at a thickness between 1800 A and 2500 A.

4. The capacitor, as defined in claim 1, wherein the metal pattern is constructed in a deposition structure including a blocking metal layer and an aluminum layer.

5. The capacitor, as defined in claim 4, wherein the blocking metal layer is constructed in a structure including a Ti layer and a TiN layer.

* * * * *

UNITED STATES PATENT AND TRADEMARK OFFICE
CERTIFICATE OF CORRECTION

PATENT NO. : 6,803,640 B1
DATED : October 12, 2004
INVENTOR(S) : In-Jung Lee et al.

It is certified that error appears in the above-identified patent and that said Letters Patent is hereby corrected as shown below:

Column 6,
Line 25, after "claim 1," please insert -- wherein --.

Signed and Sealed this

Fifteenth Day of March, 2005

JON W. DUDAS
*Director of the United States Patent and Trademark Office*